(12) United States Patent
Graham

(10) Patent No.: US 7,560,982 B2
(45) Date of Patent: Jul. 14, 2009

(54) APPARATUS FOR REDUCING APPARENT CAPACITANCE IN HIGH FREQUENCY FILTER FOR POWER LINE

(75) Inventor: Martin H. Graham, Berkeley, CA (US)

(73) Assignee: And Yet, Inc., Berkeley, CA (US)

( * ) Notice: Subject to any disclaimer, the term of this patent is extended or adjusted under 35 U.S.C. 154(b) by 0 days.

(21) Appl. No.: 11/650,098

(22) Filed: Jan. 5, 2007

(65) Prior Publication Data

US 2008/0164767 A1 Jul. 10, 2008

(51) Int. Cl.
*H02M 1/12* (2006.01)
(52) U.S. Cl. .......................................... 327/557; 363/39
(58) Field of Classification Search ................. None
See application file for complete search history.

(56) References Cited

U.S. PATENT DOCUMENTS

| | | | | |
|---|---|---|---|---|
| 3,805,178 A | * | 4/1974 | Rollett | 330/107 |
| 3,849,677 A | * | 11/1974 | Stacey et al. | 327/552 |
| 4,015,224 A | * | 3/1977 | Benzinger | 327/557 |
| 4,642,556 A | * | 2/1987 | Pecukonis | 324/67 |
| 5,260,862 A | * | 11/1993 | Marsh | 363/39 |
| 5,317,277 A | * | 5/1994 | Cavigelli | 330/109 |
| 5,614,770 A | * | 3/1997 | Suelzle | 307/105 |
| 6,169,374 B1 | * | 1/2001 | Chang | 315/224 |
| 6,344,773 B1 | * | 2/2002 | Sevastopoulos et al. | 327/558 |
| 6,424,125 B1 | | 7/2002 | Graham | |
| 6,816,004 B2 | * | 11/2004 | Easwaran et al. | 327/552 |
| 6,914,435 B2 | | 7/2005 | Graham | |
| 7,309,973 B2 | * | 12/2007 | Garza | 318/729 |
| 2002/0079957 A1 | * | 6/2002 | Hubert | 327/552 |

OTHER PUBLICATIONS

The Audio Cyclopedia, Apr. 1959, p. 377 and copyright page, Howard W. Sams & Co., Inc. (Publisher), Indianapolis, Indiana, U.S.A.
Bowden, Bill "Operational Amplifier (Op-Amp) Basics," (5 pgs) found at: http://ourworld.compuserve.com/homepages/Bill_Bowden/opamp.htm; Oct. 2006.

* cited by examiner

*Primary Examiner*—Lincoln Donovan
*Assistant Examiner*—Terry L Englund
(74) *Attorney, Agent, or Firm*—Blakely, Sokoloff, Taylor & Zafman LLP

(57) ABSTRACT

An Op amp circuit is used to provide higher capacitance to a power network to remove unwanted high frequency components from the power signal. At the primary power line frequency, a lower capacitance is presented by the circuit.

7 Claims, 1 Drawing Sheet

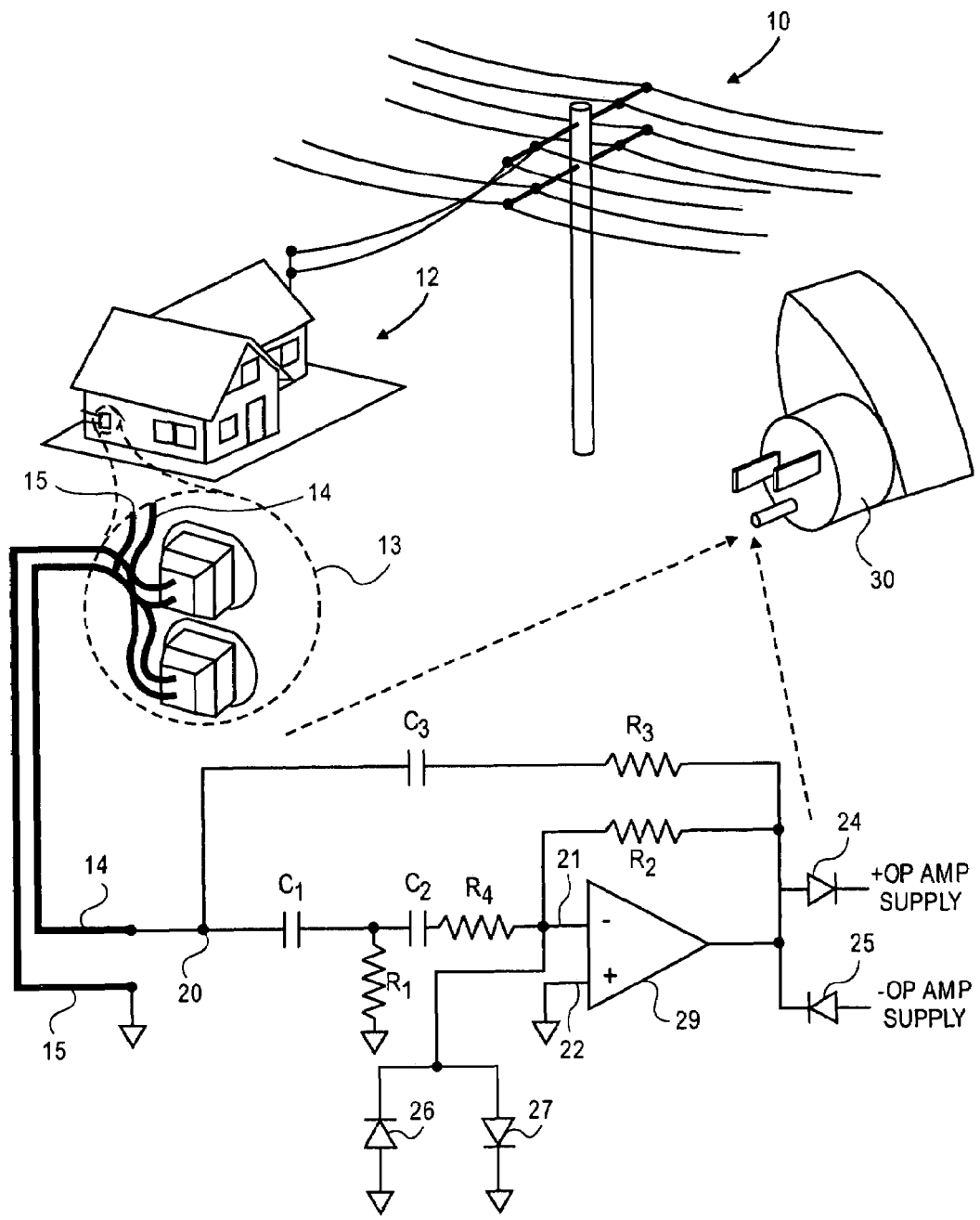

APPARATUS FOR REDUCING APPARENT CAPACITANCE IN HIGH FREQUENCY FILTER FOR POWER LINE

FIELD OF THE INVENTION

The invention relates to the field of high frequency filtering for power lines and, more specifically, reducing high frequency components in an AC power network.

PRIOR ART AND RELATED ART

Often in homes, businesses and the like, the power line signal contains numerous high-frequency components not associated with, for instance, the 60 Hz alternating current (AC) power and its harmonics. These high-frequency components are caused, for example, by switched power supplies, dimmers, motors, and other sources. There are numerous good reasons why these high-frequency components are undesirable and should be removed from the power line.

One way of reducing the high-frequency components is to connect a capacitor across the power line to shunt out the components. For instance, a 20 µF capacitor placed across a 120 volt, 60 Hz line substantially reduces the high frequency (10 KHz-400 KHz) voltage present on the power lines. These capacitors are relatively expensive, and additionally draw approximately 0.9 amps of 60 Hz current. In many applications, numerous capacitors are used (e.g. 20) placed throughout, for example, a home, and consequently, as much as 18 amps are required. As will be appreciated in other applications such as schools, hospitals and offices, even more capacitors are required. The power used by these capacitors is essentially zero since the voltage and current are in quadrature.

From the standpoint of a utility delivering power, the additional current drawn by the capacitors, even though not resulting in deliverable power, requires extra current carrying capacity by the utility and does result in additional power loss because of the $I^2R$ loss in the transmission system. If every home, school, factory, office, hospital, etc. were to use capacitors for eliminating the high frequency components, a significant increase in deliverable current would be required of the utilities. As will be seen, the present invention provides a solution to this potential problem.

Two prior art patents related to the reduction of high frequency components are U.S. Pat. No. 6,424,125, describing a discharge circuit for a capacitor, and U.S. Pat. No. 6,914,435, describing a circuit for measuring electrical pollution on a power line.

One embodiment of the present invention uses operational amplifiers (Op amps). The behavior of Op amps in numerous configurations is well-known, see for instance: http://ourworld.compuserve.com/homepages/Bill_Bowden/opamp.htm

SUMMARY OF THE INVENTION

A method and apparatus is described for providing a capacitor which exhibits a low capacitance at low frequencies (50-60 Hz) and a substantially higher capacitance at higher frequencies (10 KHz-400 KHz). In one embodiment, an operational amplifier circuit is used, where the gain of the amplifier circuit is low for the primary power line frequency, and substantially higher for the higher frequency components.

DESCRIPTION OF THE DRAWING

The FIGURE illustrates a circuit presenting a first apparent capacitance at low frequencies and a second, higher apparent capacitance at high frequencies. The circuit is illustrated coupled to home wiring, for the illustrated embodiment.

DETAILED DESCRIPTION

A method and apparatus is described for reducing high frequency components in an AC power line. In the following description, numerous specific details are set forth, such as specific component values, in order to provide a thorough understanding of the present invention. It will be apparent to one skilled in the art that the present invention may be practiced without these specific details.

In the FIGURE, a power line transmission system 10 is illustrated which is used to deliver AC power, typically of 50-60 Hz to customers such as illustrated by the house 12. Typically, two or three input feed lines are used in the United States to provide 120 V/240 V, 60 Hz service. Other countries use 50 or 60 Hz with different voltages. While the following description is in connection with power in a home, it applies equally well to businesses, schools, hospitals and other establishments.

The power from the transmission system 10 is distributed throughout the home 12 through numerous circuits, each of which has its own current protection. Often, the high frequency pollution comes about from electrical equipment drawing power from these circuits, such as switched power supplies.

The circuit used in one embodiment of the present invention illustrated in the FIGURE, may be hardwired across the power lines in a typical home circuit. Several (e.g. 20) may be distributed throughout the home. For instance, as illustrated in the FIGURE, a typical socket 13 is illustrated connected to power lines 14 and 15. The circuit of the FIGURE is coupled across lines 14 and 15 along with a power supply for supplying DC power to the circuit (not illustrated). For the illustrated embodiment, line 15 is shown as a grounded line (typically the white line in a standard US power network). Alternatively, the circuit of the FIGURE may be housed in a module such as module 30, which has standard prongs for engaging a standard socket. The module 30 also includes a power supply operating from the 60 Hz power for providing D.C. for the Op amp. Circuit modules 30 can be distributed throughout a home by simply plugging it into an ordinary socket with, for instance, one used for each circuit in the home.

The method implemented by the present invention for reducing high frequency components in the range of 10 KHz to 400 KHz, in a power network comprises presenting a first capacitance to the power line for the 50-60 Hz power, and a higher, second capacitance for the higher frequency range signals. As will be seen, the second capacitance in one embodiment is at least 10 times greater than the first capacitance. The capacitor $C_3$, as will be described, presents a first lower capacitance at 50-60 KHz and a substantially higher capacitance at the higher frequency band. It will be appreciated that the higher frequency components exist concurrently with the power signal and its harmonics.

The circuit of the FIGURE includes an ordinary operational amplifier (Op amp) 29. (In the description below, the circuit of the FIGURE is sometimes referred to as the "Op amp circuit." The Op amp alone, without the resistance capacitors and diodes of the frequency, is referred to as "Op amp." The Op amp is connected in an inverting configuration, consequently, its positive terminal 22 is coupled to ground. The line 14 is connected to the Op amp circuit at the circuit's input node 20. Node 20 is connected to the negative input terminal 21 of the Op amp 29 through two filter stages comprising $C_1$, $R_1$, and $C_2$, and the resistor $R_4$. Feedback from the output of the Op amp 29 is provided through the resistor $R_2$ which is coupled from the output of the Op amp to the input terminal 21. A capacitor $C_3$ which is coupled in series with a resistor $R_3$, is connected between the output of the Op amp 29 and the input node 20. The input terminal 21 is coupled to ground through the back-to-front diodes 26 and 27. The output of the Op amp 29 is coupled to the positive and negative Op amp power supply terminals through the front-to-back diodes 24 and 25. The connection of the Op amp 29 to a power supply is not illustrated.

To understand the operation of the Op amp circuit of the FIGURE, first consider the gain of the Op amp circuit. It is well-known that the gain of an amplifier circuit is equal to the ratio of $R_2/Z_1$, where $Z_1$ is the impedance of the input filter stages and resistor $R_4$. Consider next the capacitor $C_3$. At the node 20, the capacitor $C_3$ has apparent capacitance of $C_2$ (1-G) where G is the gain of the amplifier circuit. If for a moment we consider that $Z_1$ to be large, approaching infinity, then the gain will be zero, and at node 20, the capacitance will appear to be equal to $C_2$. On the other hand, if the ratio of $R_2/Z_1$ is 50 at the higher frequency band, then at node 20, $C_2$ will appear to have an apparent capacitance of $$(1-G) \text{ or } \frac{R_2}{Z_1} + 1$$

since the gain is negative, or simply $$\frac{R_2 + Z_1}{Z_1}.$$

If this ratio is approximately 50, then the input capacitance of $C_2$ appears to be approximately 50 $C_2$ at the higher frequencies.

The impedance $Z_1$ at low frequencies is high since $C_1$ and $C_2$ are relatively small capacitors. At high frequencies, $C_1$ has substantially lower impedance since the 3 db roll off frequency for the stages within $Z_1$ is $$\frac{10,000}{2\pi}.$$

For a first order approximation, at the higher frequencies $Z_1$ may be looked at as approximately equal to $R_4$. Then the gain at the higher frequencies (if $R_4$=10K and $R_2$=470K) is approximately 50. Therefore, $C_2$ from node 20, appears to have a capacitance of approximately equal to the actual value of $C_3$ at the power line frequency of 50-60 Hz and a capacitance of over 50$C_3$ at the higher frequencies. If in a typical application, the capacitor $C_3$ has a nominal capacitance 0.47 µF, it provides sufficient high frequency filtering.

The gain at 60 Hz and the gain at the high frequencies determine the effectiveness of $C_3$ at the high frequencies. It is important that care be taken to assure that the Op amp is not saturated for any of the frequencies. If it is saturated, the gain will drop off and the circuit will not be as effective. The two input stages shown in the FIGURE provide substantial impedance at 60 Hz, so that the primary power signal does not saturate the Op amp, for the commercially available Op amp used in the Op amp circuit embodiment discussed below. If saturation occurs, (which can be caused by signal components at low or high frequencies) it may be necessary to increase the capacitance of $C_3$, or to reconfigure the Op amp circuit.

The Op amp 29 would be destroyed if the line voltage is connected to its input, such as 120 V in a typical power network. This could occur in a transient condition. The diodes 24 and 25 and the resistor $R_3$ prevent this from occurring. The diodes 24 and 25 prevent the output of the amplifier 29 from rising above or below the supply potential for the Op amp circuit by more than a single diode drop. A resistor $R_3$ of relatively low resistance, prevents a surge through the capacitor $C_3$. Additional diodes 26 and 27 may be used at the input 21 to prevent the input node from being more than a diode drop above or below ground potential. With these protective elements, the circuit may be directly connected across the high line potential (e.g. 120 volts).

In one embodiment, the components of the circuit of the FIGURE are: $R_1$=10K ohms; $R_2$=470K ohms; $R_3$=11 ohms; $R_4$=10K ohms; $C_1$ and $C_2$=0.01 µF; $C_3$=0.47 µF; and Op amp 29, a commercially available part (LM1875). (The Op amp 29 for this embodiment is a 20 Watt audio amplifier.)

Thus, a circuit system and method has been described which provides a first capacitance at 50-60 Hz, and substantially higher capacitance at higher frequencies. Since the capacitance is substantially lower at the primary power line frequency, the larger current draw which would occur if the capacitor presented a larger capacitance at the primary frequency is reduced.

What is claimed is:

1. A system for reducing high frequency components in an AC power network comprising:
   a circuit, having an operational amplifier (OP amp) in an inverting configuration, a first resistor and a first capacitor coupled to a negative input terminal of the OP amp, a second resistor coupled to provide feedback to the negative input terminal, and a second capacitor coupled to an output of the OP amp, the circuit for providing a first capacitance at a primary frequency of the AC power network and a second, higher capacitance, in a frequency band, substantially higher than the primary frequency; and
   coupling for connecting the circuit to the power network, wherein the primary frequency of the AC power network is between 50-60 Hz, the ratio of the second resistor over the first resistor is at least 10, and the second capacitance has at least 10 times the capacitance of the first capacitance.

2. A circuit having an input node for reducing high frequency components in an AC power network comprising:
   an operational amplifier (Op amp);
   an impedance, coupled between the input node and one input terminal of the Op amp;
   a first resistor coupled between an output of the Op amp and the input terminal;
   a capacitor coupled between the output of the Op amp and the input node; and wherein a ratio of the impedance over the first resistor is at least 10 at the frequencies of the high frequency components.

3. The circuit of claim 2, including a second resistor coupled in series with the capacitor.

4. The circuit of claim 3, wherein the resistance of the second resistor is substantially less than that of the first resistor.

5. The circuit of claim 4, including back-to-front diodes coupled to the output of the Op amp.

6. The circuit of claim 2, wherein the capacitor has a capacitance of at least 0.47 µF.

7. A method of reducing high frequency components in the range of 10 KHz to 400 KHz in a 50-60 Hz power network comprising:

presenting a first capacitance in the network at 50-60 Hz; and presenting a higher, second capacitance in the network to the higher frequency components, wherein the second capacitance is at least 10 times greater than the first capacitance.

* * * * *